US012733257B2

(12) United States Patent
Zhang et al.

(10) Patent No.: US 12,733,257 B2
(45) Date of Patent: Sep. 8, 2026

(54) ARRAY SWITCH CIRCUIT SYSTEM

(71) Applicant: INDUSTRIAL TECHNOLOGY RESEARCH INSTITUTE, Hsinchu (TW)

(72) Inventors: Jie Zhang, New Taipei City (TW); Sih-Han Li, New Taipei City (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 383 days.

(21) Appl. No.: 18/427,337

(22) Filed: Jan. 30, 2024

(65) Prior Publication Data

US 2025/0151390 A1 May 8, 2025

(30) Foreign Application Priority Data

Nov. 6, 2023 (TW) ................................ 112142630

(51) Int. Cl.
*H10D 84/90* (2025.01)
*H03K 17/00* (2006.01)
(Continued)

(52) U.S. Cl.
CPC ......... *H10D 84/907* (2025.01); *H03K 17/002* (2013.01); *H03K 17/687* (2013.01);
(Continued)

(58) Field of Classification Search
CPC .. H10D 84/907; H10D 84/948; H03K 17/002; H03K 17/687; H10W 70/611;
(Continued)

(56) References Cited

U.S. PATENT DOCUMENTS 8,064,224 B2 11/2011 Mahajan et al.
9,606,408 B2 3/2017 Umezaki
(Continued)

FOREIGN PATENT DOCUMENTS

CN 101960589 A 1/2011
CN 105745752 A 7/2016
(Continued)

OTHER PUBLICATIONS

Kumar, P. et al., "Validating 2.5D System-in-Package inter-die communication on silicon interposer," IEEE Electrical Design of Advanced Packaging & Systems Symposium (EDAPS), (2014).
(Continued)

*Primary Examiner* — Mamadou L Diallo
(74) *Attorney, Agent, or Firm* — Maschoff Brennan

(57) ABSTRACT

An array switch circuit system includes a substrate, a plurality of first conductive pads, a plurality of first row/column switches, a plurality of second conductive pads and a plurality of first transmission lines. The first conductive pads are spaced apart from each other on the substrate and arranged as an array. Each of the first conductive pads has a column/row position in the array. Each of the first column/row switches connects two adjacent ones of the first conductive pad corresponding to the same column/row position. The plurality of second conductive pads are disposed on a periphery of the first conductive pad. Each of the first transmission lines connects two of the second conductive pads, and includes a first conductor strip and two second conducting strips. The two second conducting strips are respectively located on both sides of the first conducting strip and are coplanar with the first conducting strip.

11 Claims, 10 Drawing Sheets

(51) Int. Cl.

| | |
|---|---|
| ***H03K 17/687*** | (2006.01) |
| ***H10W 70/60*** | (2026.01) |
| ***H10W 70/65*** | (2026.01) |
| ***H10W 70/685*** | (2026.01) |
| ***H10W 90/00*** | (2026.01) |

(52) U.S. Cl.

CPC .......... *H10W 70/611* (2026.01); *H10W 70/65* (2026.01); *H10W 70/685* (2026.01); *H10W 90/401* (2026.01); *H10D 84/948* (2025.01)

(58) Field of Classification Search

CPC .. H10W 70/65; H10W 70/685; H10W 90/401

See application file for complete search history.

(56) References Cited

U.S. PATENT DOCUMENTS

| | | | | |
|---|---|---|---|---|
| 9,642,259 | B2 | 5/2017 | Kim et al. | |
| 10,170,458 | B2 | 1/2019 | Wang et al. | |
| 11,075,050 | B2 | 7/2021 | Wang et al. | |
| 11,410,933 | B2 | 8/2022 | Lau et al. | |
| 11,418,971 | B2 * | 8/2022 | Brechko | H04B 7/10 |
| 11,557,541 | B2 | 1/2023 | Hossain et al. | |
| 11,600,563 | B2 | 3/2023 | Pietambaram et al. | |
| 11,811,397 | B1 * | 11/2023 | Ware | G06F 1/3293 |
| 2014/0175666 | A1 | 6/2014 | Rahman et al. | |
| 2015/0235921 | A1 | 8/2015 | Shen | |
| 2017/0062294 | A1 | 3/2017 | Nasrullah et al. | |
| 2021/0082910 | A1 | 3/2021 | Or-Bach et al. | |
| 2022/0173735 | A1 * | 6/2022 | Eom | H03K 17/687 |
| 2022/0310657 | A1 * | 9/2022 | Zhang | H03K 17/002 |
| 2022/0328598 | A1 * | 10/2022 | Zhao | H10K 59/131 |
| 2023/0290417 | A1 | 9/2023 | Hioka | |
| 2023/0343632 | A1 | 10/2023 | Or-Bach et al. | |

FOREIGN PATENT DOCUMENTS

| | | | | |
|---|---|---|---|---|
| CN | 105206610 | B * | 11/2017 | |
| CN | 111048877 | B | 5/2022 | |
| CN | 217387150 | U | 9/2022 | |
| FR | 2587158 | A1 * | 3/1987 | H03K 19/17748 |
| TW | I651828 | B | 2/2019 | |
| TW | I768874 | B | 6/2022 | |
| TW | 769789 | B1 * | 10/2022 | |
| TW | 202337007 | A | 9/2023 | |
| TW | 202341449 | A | 10/2023 | |

OTHER PUBLICATIONS

Mahajan, R. et al., "Embedded Multi-Die Interconnect Bridge (EMIB)—A High Density, High Bandwidth Packaging Interconnect," IEEE 66th Electronic Components and Technology Conference (ECTC), pp. 557-565 (2016).

Hsiang-Yao, H. et al., "Process Development of Fan-Out interposer with Multi-layer RDL for 2.5D System in Package," IEEE 20th Electronics Packaging Technology Conference (EPTC), pp. 406-410 (2018).

Xie, B. et al., "Power Delivery Decoupling Scheme for EMIB Packages," IEEE 28th Conference on Electrical Performance of Electronic Packaging and Systems (EPEPS), (2019).

Zhang, J. et al., "An Embedded Multi-Die Active Bridge (EMAB) Chip for Rapid-Prototype Programmable 2.5D/3D Packaging Technology," IEEE Symposium on VLSI Technology and Circuits (VLSI Technology and Circuits), pp. 262-263 (2022).

TW Office Action dated Aug. 19, 2024 in application 112142630.

* cited by examiner

ARRAY SWITCH CIRCUIT SYSTEM

CROSS-REFERENCE TO RELATED APPLICATIONS

This non-provisional application claims priority under 35 U.S.C. § 119 (a) on Patent Application No(s). 112142630 filed in Republic of China (ROC) on Nov. 6, 2023, the entire contents of which are hereby incorporated by reference.

BACKGROUND

1. Technical Field

This disclosure relates to an array switch circuit system, especially an array switch circuit system able to be applied to system packaging.

2. Related Art

Conventionally, system in a package (SiP) refers to an integrated circuit (IC) enclosing multiple chips. The connections between the chips and the input and output pin connections of the package must be wired through the carrier board wires.

In order to solve the problem of excessive line width and line spacing of packaging carrier board wires, the Embedded Multi-die Interconnect Bridge (EMIB) packaging technology was developed. By embedding silicon wafers in the packaging carrier board, the thin line width and line spacing in the silicon wafer are used to solve the problem of excessive line width and line spacing on the packaging carrier board, thereby greatly increasing the number of connection lines.

Using advanced packaging combined with Embedded Multi-die Active Bridge (EMAB) makes programmable path correction possible.

SUMMARY

According to one or more embodiment of this disclosure, an array switch circuit system includes a substrate, a plurality of first conductive pads, a plurality of first row switches, a plurality of first column switches, a plurality of second conductive pads and a plurality of first transmission lines. The plurality of first conductive pads are spaced apart from each other on the substrate and arranged as an array, wherein each of the plurality of first conductive pads has a row position and a column position in the array. The plurality of first row switches are disposed on the substrate, wherein each of the plurality of first row switches connects two adjacent ones of the plurality of first conductive pads corresponding to a same row position. The plurality of first column switches are disposed on the substrate, wherein each of the plurality of first column switches connects two adjacent ones of the plurality of first conductive pads corresponding to a same column position. The plurality of second conductive pads are disposed on the substrate and disposed on a periphery of the plurality of first conductive pads. The plurality of first transmission lines are disposed on the substrate, wherein each of the plurality of first transmission lines connects two of the plurality of second conductive pads and includes a first conducting strip and two second conducting strips, and the two second conducting strips are respectively located on both sides of the first conducting strip and are coplanar with the first conducting strip.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. According to the description, claims and the drawings disclosed in the specification, one skilled in the art may easily understand the concepts and features of the present invention. The following embodiments further illustrate various aspects of the present invention, but are not meant to limit the scope of the present invention.

Figure 1:
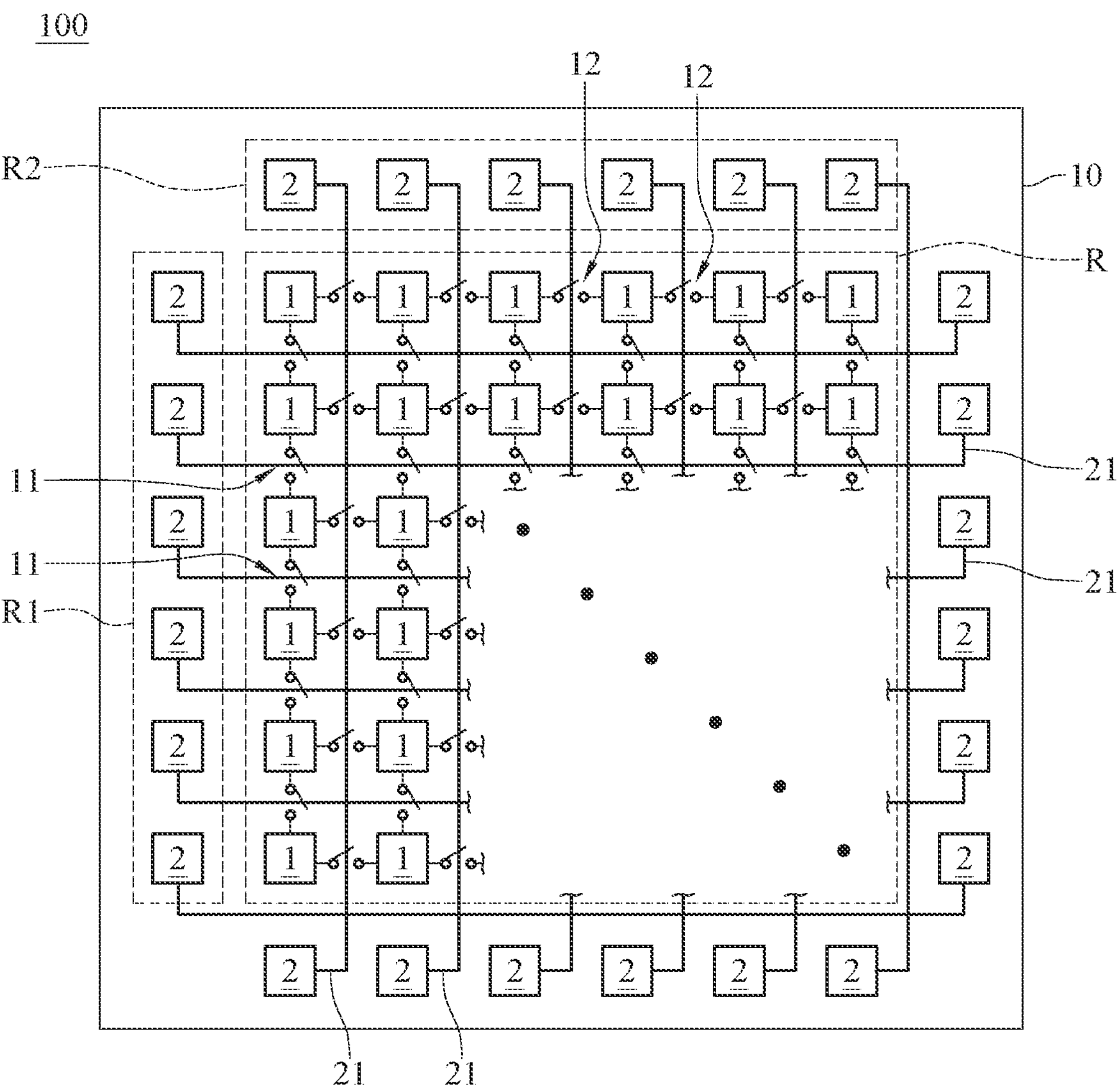
FIG. 1 is a schematic circuit diagram of an array switch circuit system according to an embodiment of the present disclosure.

Please refer to FIG. 1 which is a schematic circuit diagram of an array switch circuit system according to an embodiment of the present disclosure. As shown in FIG. 1, an array switch circuit system 100 includes a substrate 10, a plurality of first conductive pads 1, a plurality of first column switches 11, a plurality of first row switches 12, a plurality of second conductive pads 2 and a plurality of first transmission lines 21. The plurality of first conductive pads 1 are spaced apart from each other on the substrate 10 and arranged as an array R, wherein each of the plurality of first conductive pads 1 has a row position and a column position in the array R. The plurality of first column switches 11 are disposed on the substrate 10, wherein each of the plurality of first column switches 11 connects two adjacent ones of the plurality of first conductive pads 1 corresponding to a same column position. The plurality of first row switches 12 are disposed on the substrate 10, wherein each of the plurality of first row switches 12 connects two adjacent ones of the plurality of first conductive pads 1 corresponding to a same row position. The plurality of second conductive pads 2 are disposed on the substrate 10 and disposed on a periphery of the plurality of first conductive pads 1. The plurality of first transmission lines 21 are disposed on the substrate 10, wherein each of the plurality of first transmission lines 21 connects two of the plurality of second conductive pads 2. The plurality of first transmission lines 21 each includes a first conducting strip and two second conducting strips, and the two second conducting strips are respectively located on both sides of the first conducting strip and are coplanar with the first conducting strip, wherein the specific arrangement is described later.

In this embodiment, the first conductive pads 1 and the second conductive pads 2 may be conductive pads made of metal materials. The first conductive pads 1 are arranged as an array without any limitation to the number of rows and columns of the first conductive pads 1, and the array shown in FIG. 1 merely serves as an example. The second conductive pads 2 are arranged on the periphery of the first conductive pads 1. In the embodiment of FIG. 1, a plurality of second conductive pads 2 are arranged into two conductive pad columns R1 and two conductive pad rows R2 (only one row and one column are shown for schematic presentation in FIG. 1). The two conductive pad columns R1 are located at opposite sides of the array R, the two conductive pad rows R2 are located at another opposite sides of the array R, and the two of the plurality of second conductive pads 2 that are connected to one of the plurality of first transmission lines 21 belong to two conductive pad columns R1 respectively, or belong to two conductive pad rows R2 respectively. Specifically, the first transmission line 21 may extend along the row direction or column direction of the array R and electrically connect the two second conductive pads 2 located on both sides of the array R. The number of second conductive pads 2 in one row or one column is merely illustrated in FIG. 1 as an example, which is not limited thereto.

By controlling the plurality of first column switches 11 and the plurality of first row switches 12 of the array switch circuit system 100 described above, the connection relation between two of any of first conductive pads 1 may be controlled to be in a conductive state or an off state. That is, the connection of the redistribution layer may be changed through the control of the array switch, thereby solving the problem of needing to redesign the redistribution layer. Furthermore, the array switch circuit system 100 may further include an active switch control circuit to control the array switch. The specific structure of the control circuit is described later. Furthermore, the array switch circuit system 100 may transmit high-speed signals between the second conductive pads 2 through the first transmission line 21, wherein the first transmission line 21 may be implemented through a specially designed coplanar waveguide, which solves the problem of impedance matching of high-speed signals. In this way, the overall packaging carrier board of the array switch circuit system 100 only needs customization of the metal layer connecting the transmission line, and the rest are prefabricated designs. Product development period may be shortened, R&D costs may be reduced, and technology gaps for various product packaging may be filled.

Figure 2:
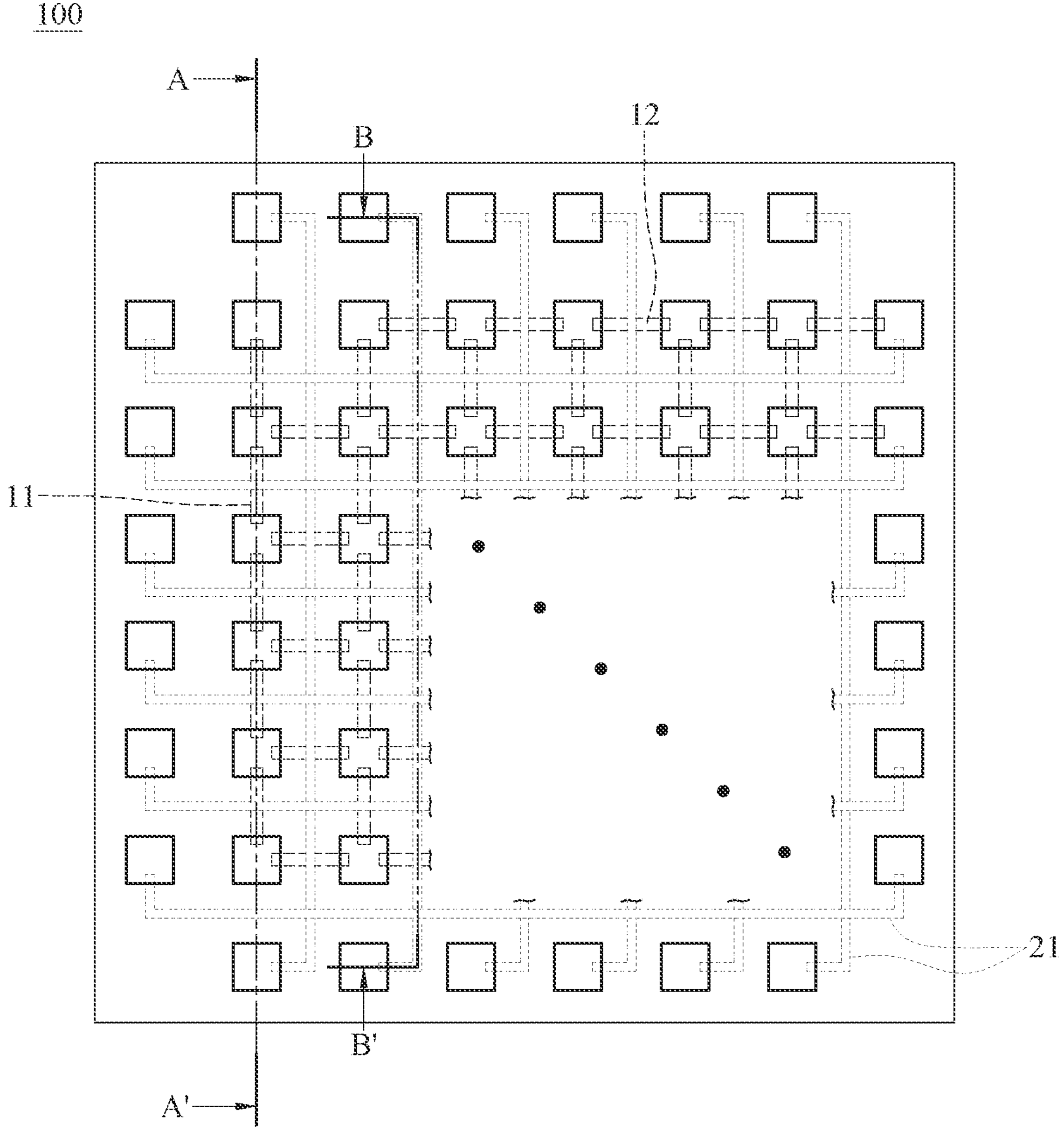
FIG. 2 is a schematic structural diagram of an array switch circuit system according to an embodiment of the present disclosure.

Please refer to FIG. 2 along with FIG. 1, FIG. 2 is a schematic structural diagram of an array switch circuit system according to an embodiment of the present disclosure. As shown in FIG. 2, the substrate 10 of the array switch circuit system 100 may include multiple layers. The first conductive pad 1 and the second conductive pad 2 are disposed on the first layer (or the uppermost layer) of the plurality of layers, the plurality of first transmission lines 21 and the plurality of first column switches 11 are located on different layers of the plurality of layers, and the plurality of first transmission lines 21 and the plurality of first row switches 12 are located on different layers of the plurality of layers, so that the first transmission line 21 and the first column switch 11 and the first row switch 12 do not interfere with each other. In this embodiment, the layer of the first transmission line 21 is located between the layer of the first conductive pad 1 and the second conductive pad 2 and the layer of the first column switch 11 and the first row switch 12. The layer of the first transmission line 21 may be closer to the layer of the first conductive pad 1 and the second conductive pad 2 and farther away from the layer of the first column switch 11 and the first row switch 12. It should be noted that the first transmission lines 21 extending along the column direction of the array R and the first transmission lines 21 extending along the row direction of the array R may be substantially located on the same layer. For example, one of the two intersecting first transmission lines 21 located on the same layer may be connected to an adjacent layer through a through hole to cross another first transmission line 21, wherein the two intersecting first transmission lines 21 may be electrically isolated from each other through an insulating layer (such as silicon dioxide $SiO_2$) at the intersecting spot.

Figure 3:
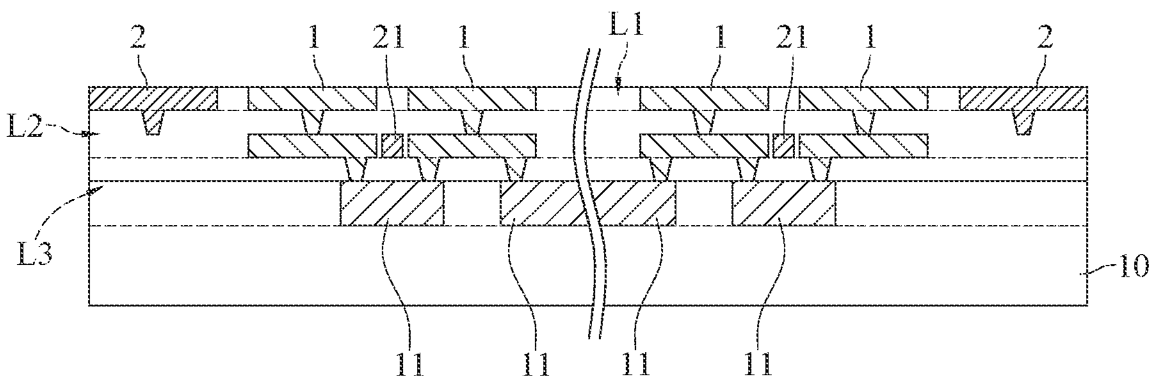
FIG. 3 is a schematic cross-sectional view of the array switch circuit system shown along the section line A-A' of FIG. 2 according to an embodiment of the present disclosure.

Please refer to FIG. 3 along with FIGS. 1 and 2, FIG. 3 is a schematic cross-sectional view of the array switch circuit system shown along the section line A-A' of FIG. 2 according to an embodiment of the present disclosure. As shown in FIG. 3, the multiple layers of the substrate 10 may be distinguished into a first layer L1, a second layer L2, and a third layer L3. It should be noted that FIG. 3 schematically shows the composition of the substrate 10 without limitation, and in other embodiments, one or more additional layers may be included between any two layers shown in FIG. 3. As shown in FIG. 3, the second conductive pad 2 and the first conductive pad 1 are disposed on the first layer L1 of the substrate 10, wherein the second conductive pad 2 and the first conductive pad 1 may be electrically connected to the layer below through their respective vias. The first transmission line 21 is disposed on the second layer L2 of the substrate 10. The first column switch 11 is disposed on the third layer L3 of the substrate 10. In this way, two first conductive pads 1 adjacent to each other in the column direction may be electrically connected through the first column switch 11. In this embodiment, the second layer L2 provided with the first transmission line 21 is closer to the first layer L1 provided with the first conductive pad 1 and the second conductive pad 2, and the second layer L2 is farther away from the third layer L3 provided with the first column switch 11. Therefore, the mutual interference between the first transmission line 21 and the first column switch 11 may be further reduced.

Figure 4:
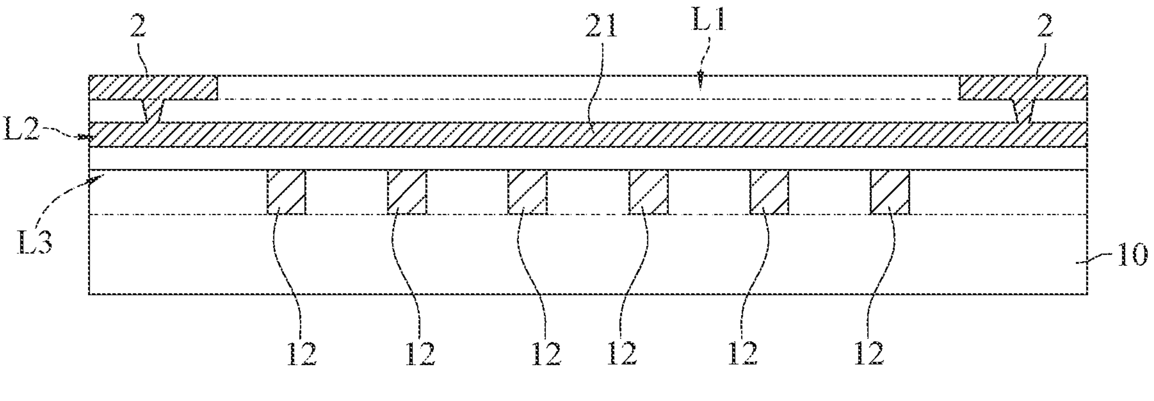
FIG. 4 is a schematic cross-sectional view of the array switch circuit system shown along the section line B-B' of FIG. 2 according to an embodiment of the present disclosure.

Please refer to FIG. 4 along with FIGS. 1 and 2, FIG. 4 is a schematic cross-sectional view of the array switch circuit system shown along the section line B-B' of FIG. 2 according to an embodiment of the present disclosure. As shown in FIG. 4, the two second conductive pads 2 located on both sides and provided on the first layer L1 may be electrically connected to each other through the first transmission line 21 provided on the second layer body L2. This electrical transmission path is separated from the first row switch 12 provided on the third layer L3, so that the mutual interference between the first transmission line 21 and the first row switch 12 may be effectively reduced. Specifically, multiple layers may be disposed between the second layer L2 and the third layer L3, and the first layer L1 and the second layer L2 may be adjacent to each other, to achieve the above effects. It should be noted that the section lines A-A' and B-B' shown in FIGS. 2 to 4 are selected along the column direction of the array. However, the section lines may also be selected along the row direction of the array. The corresponding cross-sectional structure is the same as FIGS. 3 and 4, and the repeated description is omitted herein.

Figure 5:
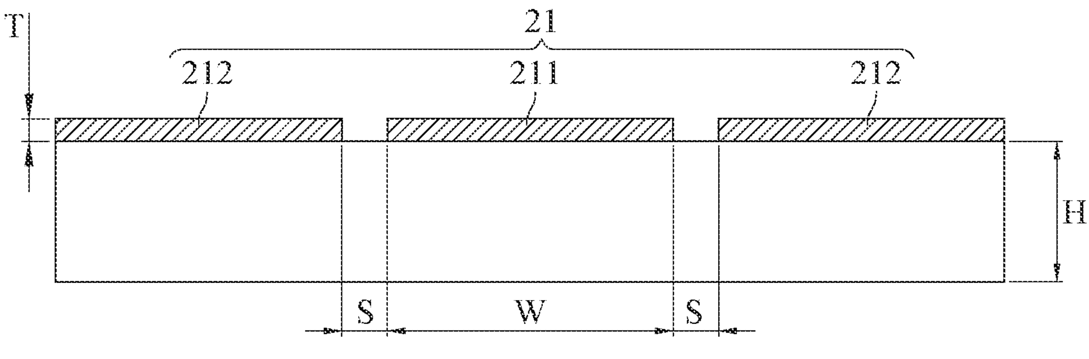
FIG. 5 is a schematic diagram of a first transmission line implemented by a coplanar waveguide of an array switch circuit system according to an embodiment of the present disclosure.

Please refer to FIG. 5 which is a schematic diagram of a first transmission line implemented by a coplanar waveguide of an array switch circuit system according to an embodiment of the present disclosure. As shown in FIG. 5, the first transmission line 21 may be implemented through a coplanar waveguide including a first conducting strip 211 and two second conducting strips 212 specifically, wherein the two second conducting strips 212 are located on both sides of the first conducting strip 211 and are coplanar with the first conducting strip 211. In this embodiment, the characteristic impedance of the first transmission line 21 is related to the width W of the first conducting strip 211, the spacing S between the first conducting strip 211 and the two second conducting strips 212, the conducting layer thickness T of the first conducting strip 211 and the second conducting strip 212, and the dielectric layer thickness H of the first layer of the substrate on which the first transmission line 21 is located. It should be noted that FIG. 5 is a cross-section view of the first transmission line 21. The first conducting strip 211 serves as a signal transmission channel of the first transmission line 21, and the two second conducting strips 212 serve as ground terminals. The characteristic impedance of the first transmission line 21 in this embodiment is not related to the length of the transmission line.

In this embodiment, the relationship between the characteristic impedance ($Z_0$) of the first transmission line 21 and the width W, the spacing S, the conducting layer thickness T and the dielectric layer thickness H may be obtained through the following equations (1-14).

$$a = W \times 2 \quad \text{Equation (1)}$$

$$b = \frac{W + 2S}{2} \quad \text{Equation (2)}$$

$$\text{k\_1} = \frac{a}{b} \quad \text{Equation (3)}$$

$$\text{k\_2} = \frac{\sinh\left(\frac{\pi \times a}{2H}\right)}{\sinh\left(\frac{\pi \times b}{2H}\right)} \quad \text{Equation (4)}$$

$$k1p = \sqrt{1 - \text{k\_1}^2} \quad \text{Equation (5)}$$

$$k2p = \sqrt{1 - \text{k\_2}^2} \quad \text{Equation (6)}$$

-continued $$\varepsilon_{re} = 1 + \frac{(\varepsilon_r - 1) \times \left(\int_0^1 \left[(1 - t^2)(1 - \text{k\_2}t^2)\right]^{\frac{-1}{2}} dt\right) \times \left(\int_0^1 \left[(1 - t^2)(1 - k1pt^2)\right]^{\frac{-1}{2}} dt\right)}{2 \times \left(\int_0^1 \left[(1 - t^2)(1 - \text{k\_1}t^2)\right]^{\frac{-1}{2}} dt\right) \times \left(\int_0^1 \left[(1 - t^2)(1 - k2pt^2)\right]^{\frac{-1}{2}} dt\right)} \quad \text{Equation (7)}$$

$$\Delta = \left(\frac{1.25T}{\pi}\right)\left[1 + \ln\left(\frac{4\pi W}{T}\right)\right] \quad \text{Equation (8)}$$

$$W_e = W + \Delta \quad \text{Equation (9)}$$

$$S_e = S - \Delta \quad \text{Equation (10)}$$

$$k_e = \frac{W_e}{W_e + 2S_e} = k + \frac{(1 - k^2)\Delta}{2S} \quad \text{Equation (11)}$$

$$k_e p = \sqrt{1 - {k_e}^2} \quad \text{Equation (12)}$$

$$\varepsilon_{re}^T = \varepsilon_{re} - \frac{\frac{0.7(\varepsilon_{re} - 1)T}{S}}{\frac{\left(\int_0^1 \left[(1 - t^2)(1 - kt^2)\right]^{\frac{-1}{2}} dt\right)}{\left(\int_0^1 \left[(1 - t^2)(1 - kpt^2)\right]^{\frac{-1}{2}} dt\right)} + \frac{0.7T}{S}} \quad \text{Equation (13)}$$

$$Z_0 = \frac{30\pi \times \left(\int_0^1 \left[(1 - t^2)(1 - k_e pt^2)\right]^{\frac{-1}{2}} dt\right)}{\sqrt{\varepsilon_{re}^T} \times \left(\int_0^1 \left[(1 - t^2)(1 - k_e t^2)\right]^{\frac{-1}{2}} dt\right)} \quad \text{Equation (14)}$$

In the above equations, Ere is the material dielectric constant of the substrate, and $$\varepsilon_{re}^T$$

is the material dielectric constant of the substrate considering the thickness T of the conducting layer. Through the above relationship, a coplanar waveguide (first transmission line 21) with specific impedance may be designed to solve the impedance matching problem of high-speed signals. In one embodiment, the range of the characteristic impedance of the first transmission line 21 is designed to range from 25 to 150 ohms. In the present disclosure, the design method of realizing the coplanar waveguide of the first transmission line 21 is not limited to the above equations (1) to (14). However, through the above equations (1) to (14), the coplanar waveguide may have a better impedance matching effect.

Figure 6:
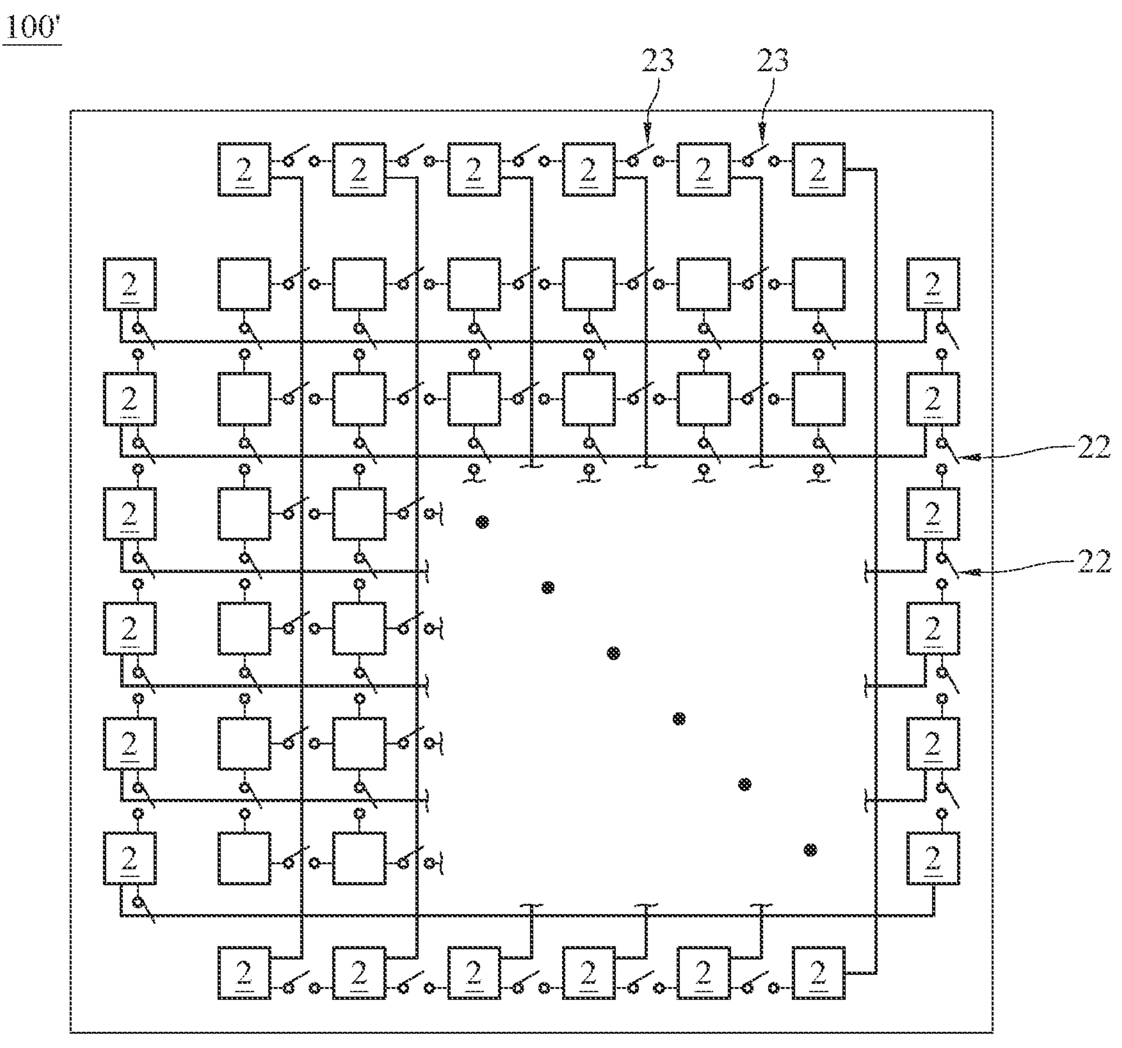
FIG. 6 is a schematic circuit diagram of an array switch circuit system according to another embodiment of the present disclosure.

Please refer to FIG. 6 which is a schematic circuit diagram of an array switch circuit system according to another embodiment of the present disclosure. As shown in FIG. 6, the configuration of the array switch circuit system 100' of this embodiment in the first conductive pads in the central area and the second conductive pads in the peripheral area is basically the same as that of the embodiment shown in FIG. 1, and repeated description is omitted herein. In this embodiment, in addition to the components included in the array switch circuit system 100 of FIG. 1, the array switch circuit system 100' further includes a plurality of second column switches 22 and a plurality of second row switches 23. The second column switches 22 are disposed on the substrate, and each of the second column switches 22 connects two adjacent second conductive pads 2 arranged in a conductive pad column. The second row switches 23 are disposed on the substrate, and each of the second row switches 23 connects two adjacent second conductive pads 2 arranged in a conductive pad row. Through the configuration of the second column switch 22 and the second row switch 23 in this embodiment, the plurality of second conductive pads 2 in this embodiment may not only transmit high-speed signals through the first transmission line 21, but also have the function of switching input and output signals.

Figure 7:
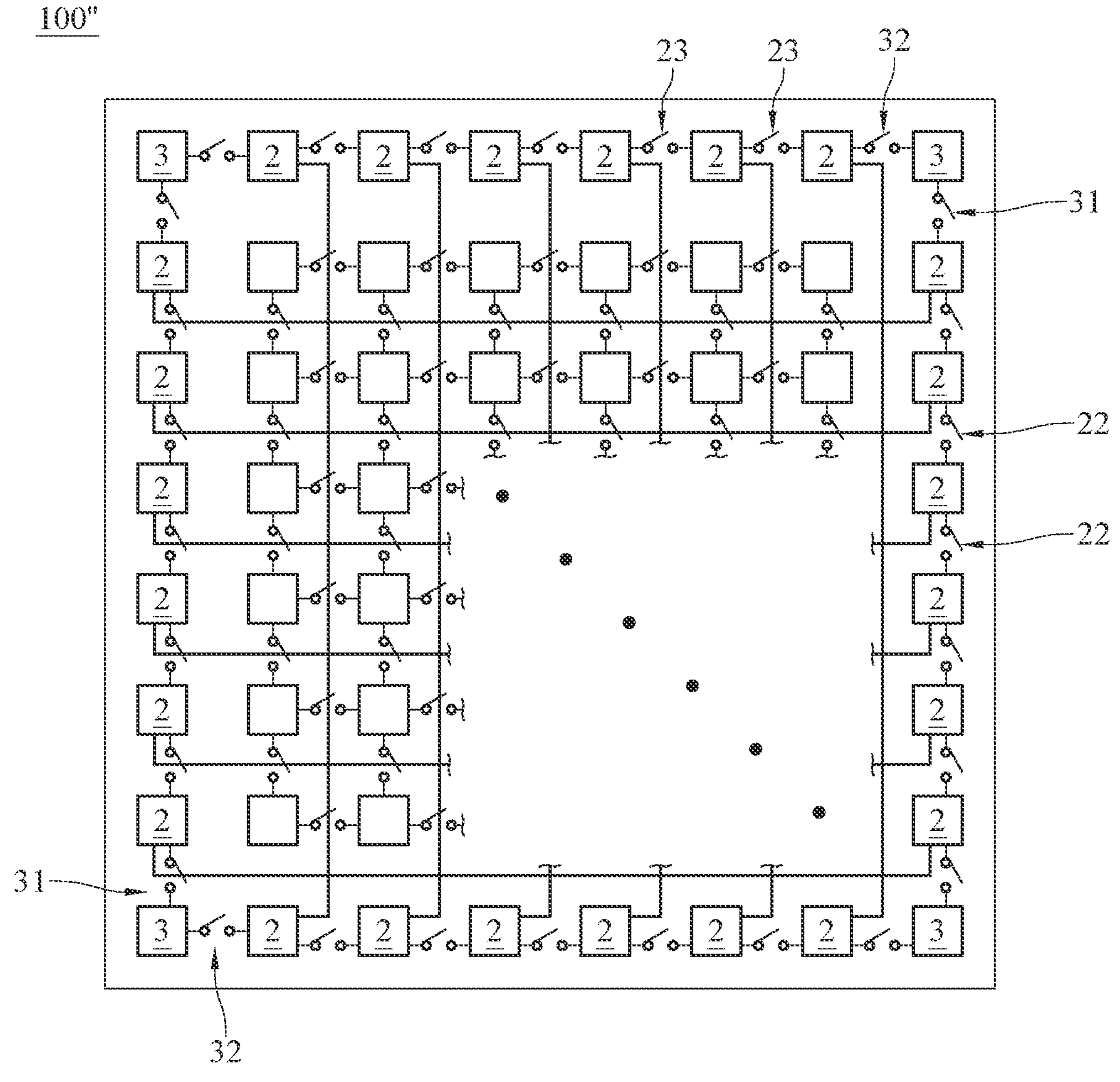
FIG. 7 is a schematic circuit diagram of an array switch circuit system according to still another embodiment of the present disclosure.

Please refer to FIG. 7 along with FIG. 6, FIG. 7 is a schematic circuit diagram of an array switch circuit system according to still another embodiment of the present disclosure. As shown in FIG. 7, the configuration of the array switch circuit system 100" of this embodiment in the first conductive pad, the second conductive pad, the second column switch 22 and the second row switch 23 is basically the same as that of the embodiment shown in FIG. 6, and repeated description is omitted herein. In this embodiment, in addition to the components included in the array switch circuit system 100' shown in FIG. 6, the array switch circuit system 100" further includes one or more third conductive pads 3 disposed on the first layer of the substrate, and third column switches 31 and third row switches 32 disposed on lower layer of the substrate. The third conductive pad 3 is connected to the conductive pad column including the second conductive pad 2 through the third column switch 31, and is connected to the conductive pad row including the second conductive pad 2 through the third row switch 32.

Through the configuration of the third conductive pad 3, the third column switch 31 and the third row switch 32 of this embodiment, the array switch circuit system 100" of this embodiment may have a variety of signal transmission paths. For example, the second conductive pad 2 of the array switch circuit system 100 shown in FIG. 1 may merely be electrically connected to the second conductive pad 2 on the opposite side through the first transmission line 21; the second conductive pad 2 of the array switch circuit system 100' shown in FIG. 6 may be electrically connected to the second conductive pad 2 on the same side through the second column switch 22 and/or the second row switch 23; the second conductive pad 2 of the array switch circuit system 100" shown in FIG. 7 may be electrically connected to the surrounding second conductive pad 2 through the third conductive pad 3, the third column switch 31 and/or the third row switch 32. It should be noted that the second column switch 22, the second row switch 23, the third column switch 31 and the third row switch 32 shown in FIGS. 6 and 7 may be disposed on the same layer of the substrate (the third layer L3) as the first column switch 11 shown in FIG. 3, and may also have a larger separation space from the first column switch 11 and the first transmission line 21 to avoid mutual interference in signal transmission.

Figure 8:
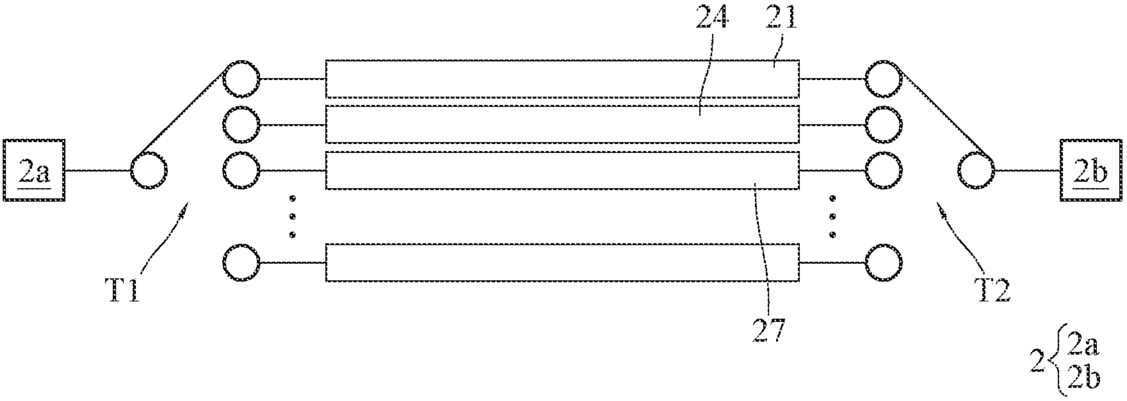
FIG. 8 is a schematic diagram of an array switch circuit system with multiple transmission lines between two second conductive pads according to other embodiments of the present disclosure.

Please refer to FIG. 8 which is a schematic diagram of an array switch circuit system with multiple transmission lines between two second conductive pads 2 according to other embodiments of the present disclosure. In the aforementioned embodiment, the two second conductive pads 2 are electrically connected to each other through a first transmission line 21, and the first transmission line 21 may have a specific impedance. In other embodiments, the two second conductive pads may also be electrically connected to each other through a plurality of transmission lines with different impedances. As shown in FIG. 8, in this embodiment, a target transmission line among the plurality of first transmission lines 21 of the array switch circuit system is connected to a first target conductive pad 2*a* and a second target conductive pad 2*b* among the second conductive pads 2, and the array switch circuit system further includes a second transmission line 24, a first switching component T1 and a second switching component T2. The second transmission line 24 has an impedance different from the target transmission line (first transmission line 21). The first switching component T1 is connected to the first target conductive pad 2*a*, the target transmission line (first transmission line 21) and the second transmission line 24, and is configured to switch to conduct one of the target transmission line (first transmission line 21) and the second transmission line 24 with the first target conductive pad 2*a*. The second switching component T2 is connected to the second target conductive pad 2*b*, the target transmission line (first transmission line 21) and the second transmission line 24, and is configured to switch to conduct one of the target transmission line (first transmission line 21) and the second transmission line 24 with the second target conductive pad 2*b*.

Similarly, the array switch circuit system may also include a third transmission line 27 or more transmission lines with different impedances between the two second conductive pads. The first switching component T1 and the second switching component T2 in this embodiment may be exemplified by high-frequency single-pole multi-throw switches. By including multiple transmission lines with different impedances, the array switch circuit system may select signal transmission paths with different impedances according to requirement in different applications, thereby increasing application flexibility.

In particular, the array switch circuit system described in the above embodiments may be implemented with a bridge chip, which may be an embedded multi-die hybrid bridge chip (EMHB) that may be applied to system packaging. This array switch circuit system combines the architecture of embedded multi-die interconnect bridge chip and embedded multi-die active bridge chip.

Figure 9:
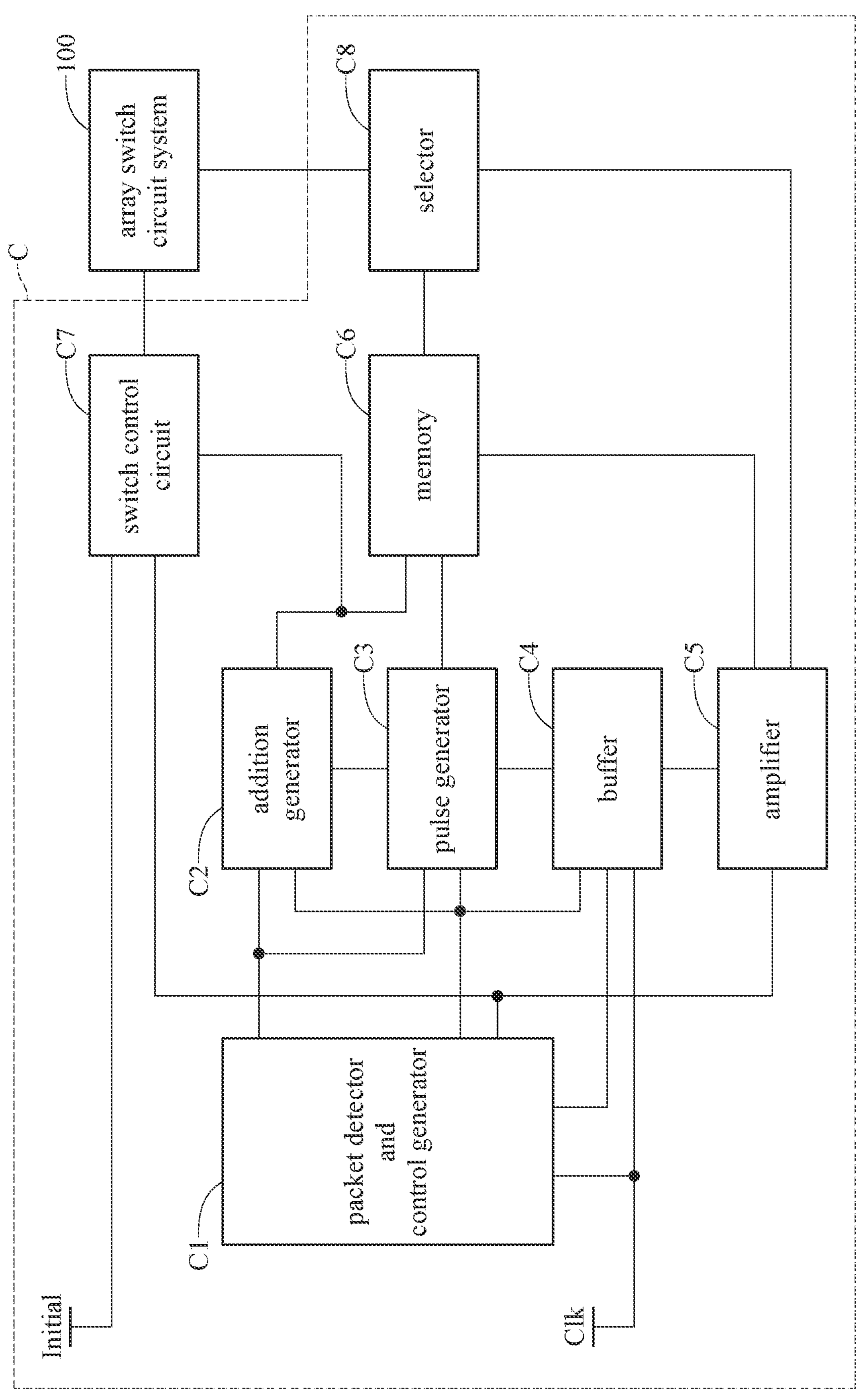
FIG. 9 is a block diagram of a switch control circuit of an array switch circuit system according to an embodiment of the present disclosure.

Please refer to FIG. 9 which is a block diagram of a switch control circuit of an array switch circuit system according to an embodiment of the present disclosure. As shown in FIG. 9, each switching component of the array switch circuit system 100 in the present disclosure may be controlled by a switch control circuit C, wherein the switch control circuit C may include a packet detector and control generator C1, an addition generator C2, a pulse generator C3, a buffer C4, an amplifier C5, a memory C6, a switch control circuit C7 and a selector C8. In this embodiment, the memory may be a one-time programmable (OTP) memory or a multiple-times programmable (MTP) memory. The switch control circuit C may have two switch control modes. One control mode is to burn (record) the switching status of the switch into the one-time programmable memory, and then to directly read the switching status of the switch from the memory each time the chip is used; another control mode is a dynamic control mode that directly transmits the switching status of the switch to the array switch circuit system, and the switch may be switched at any time. However, the switching status of the switch may be lost after the chip is powered off, so the switching status of the switch needs to be re-entered. For example, after receiving the switching status data, the packet detector and control generator C1 may determine whether to write or read the memory C6 or directly control the array switch circuit system 100, and generate corresponding control signals to the memory C6 and the selector C8, and transmit the switching status data to the memory C6 or the array switch circuit system 100. In addition, the initial signal (Initial) is sent to the switch control circuit C7, and the clock signal Clk is sent to the packet detector and the control generator C1 and the buffer C4.

Figure 10:
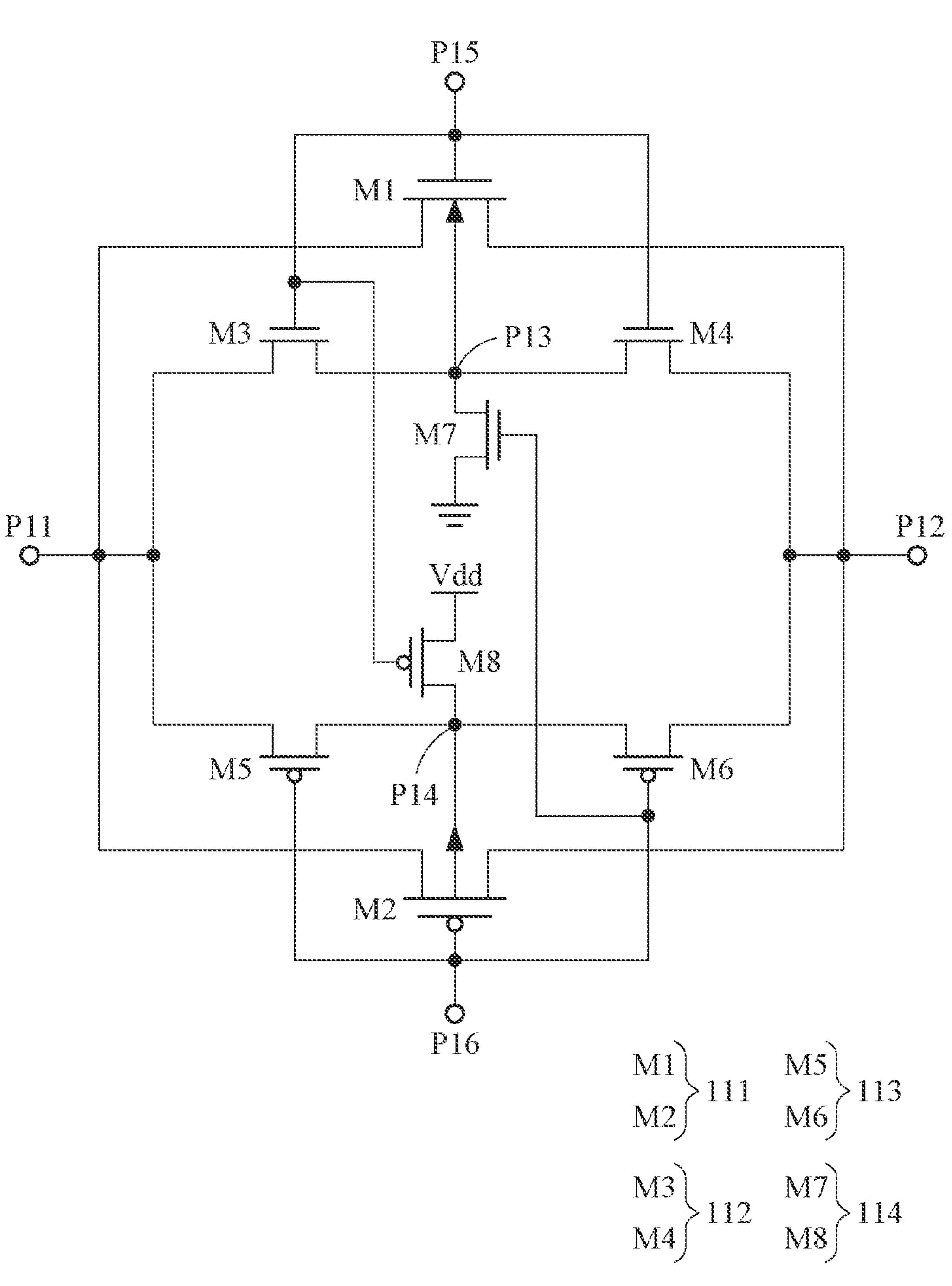
FIG. 10 is a circuit diagram of a switch circuit of an array switch circuit system according to an embodiment of the present disclosure.

Please refer to FIG. 10 which is a circuit diagram of a switch circuit of an array switch circuit system according to an embodiment of the present disclosure. As shown in FIG. 10, the switch circuit (first column switch 11) includes a transmission gate 111, two base control sub-circuits 112 and 113, and transistor group 114. The transmission gate 111 includes transistors M1 and M2, has two input/output (I/O) terminals P11 and P12, two base control terminal P13 and P14 and two gate control terminals P15 and P16, and is configured to make the two I/O terminals P11 and P12 conduct or not conduct with each other according to voltages of the two gate control terminals P15 and P16. Particularly, the source of the transistor M1 and the drain of the transistor M2 are connected to each other to serve as the I/O terminal P11, the drain of the transistor M1 and the source of the transistor M2 are connected to each other to serve as the I/O terminal P12.

The base control sub-circuit 112 includes a transistor M3 and a transistor M4. The first terminal of the transistor M3 is electrically connected to the I/O terminal P11, the second terminal of the transistor M3 is electrically connected the base control terminal P13, and the control terminal of the transistor M3 is electrically connected to the gate control terminal P15. The first terminal of the transistor M4 is electrically connected to the base control terminal P13, the second terminal of the transistor M4 is electrically connected the I/O terminal P12, and the control terminal of transistor M4 is electrically connected to the gate control terminal P15. The base control sub-circuit 113 includes transistors M5 and M6. The first terminal of the transistor M5 is electrically connected to the I/O terminal P11, the second terminal of the transistor M5 is electrically connected the base control terminal P14, and the control terminal of the transistor M5 is electrically connected to the gate control terminal P16. The first terminal of the transistor M6 is electrically connected to the base control terminal P14, the second terminal of the transistor M6 is electrically connected the I/O terminal P12, and the control terminal of the transistor M6 is electrically connected to the gate control terminal P16.

The transistor group 114 includes transistors M7 and M8. The first terminal of the transistor M7 is electrically connected the base control terminal P13, the second terminal of the transistor M7 is configured to receive a ground voltage, and the control terminal of the transistor M7 is electrically connected to the gate control terminal P16. The first terminal of the transistor M8 is configured to receive the working voltage Vdd, the second terminal of the transistor M8 is electrically connected the base control terminal P14, and the control terminal of the transistor M8 is electrically connected to the gate control terminal P15.

With the circuit structure above, the two base control sub-circuits 112 and 113 and the transistor group 114 may dynamically adjust the base voltages of the two transistors M1 and M2 according to the on/off state of the transmission gate 111. Moreover, the dynamic adjustment operation may include: when the transmission gate 111 is in on state, the two base control sub-circuits 112 and 113 and the transistor group 114 synchronize the base voltages of the transistors M1 and M2 with the voltage of the input signal (smaller than a default value, or even equal 0). Additionally, when the transmission gate 111 is in off state, the two base control sub-circuits 112 and 113 and the transistor group 114 adjust the base voltages of transistors M1 and M2 of the transmission gate 111 to the working voltage Vdd and the ground voltage, respectively, thereby preventing the problem of current leakage at the base end. Moreover, the area occupied by the wires of the switch circuit 11 may be similar to that of the general transmission gate. That is, the switch circuit 11 is better than the general transmission gate in characteristics and its occupied area is equivalent to that of the general transmission gate, and therefore has advantage in comparison.

Also, the two base control sub-circuits 112 and 113 and the transistor group 114 of the switch circuit (first column switch 11) in the present embodiment may constitute a circuit structure of which two terminals are balanced, so that no matter if the switch circuit 11 performs the transmission in a normal direction (for example, from the I/O terminal P11 to the I/O terminal P12) or in an opposite direction (for example, from the I/O terminal P12 to the I/O terminal P11), the switch circuit 11 may have the same resistance value.

The circuit structure of the two base control sub-circuits 112 and 113 of the switch circuit (first column switch 11) mentioned above may be regarded as the two base control structures each including a first transistor and a second transistor, and the circuit structure of the transistor group 114 may be regarded as including a third transistor and a fourth transistor. The electrical connection relationship of each of the base control circuits 112/113 and the transmission gate 111 may be regarded as: the first transistor having a first terminal electrically connected to a first one of the two I/O terminals, a second terminal electrically connected to a first node, and a control terminal electrically connected to a second node; the second transistor having a first terminal electrically connected to the first node, a second terminal electrically connected to a second one of the two I/O terminals and a control terminal electrically connected to the second node; wherein the first node and the second node corresponding to one of the two base control sub-circuits are the first one of the two base control terminals and the second one of the two gate control terminals, respectively, and the first node and the second node of the other one of the two base control sub-circuits are the second one of the two base control terminals and the first one of the two gate control terminals, respectively. The electrical connection relationship of the transistor group 114 and the transmission gate 111 may be regarded as: a third transistor having a first terminal electrically connected to a first one of the two base control terminals, a second terminal which is grounded, and a control terminal electrically connected to a first one of the two gate control terminals; a fourth transistor having a first terminal configured to receive a working voltage, a second terminal electrically connected to a second one of the two base control terminals and a control terminal electrically connected a second one of the two gate control terminals.

Figure 11:
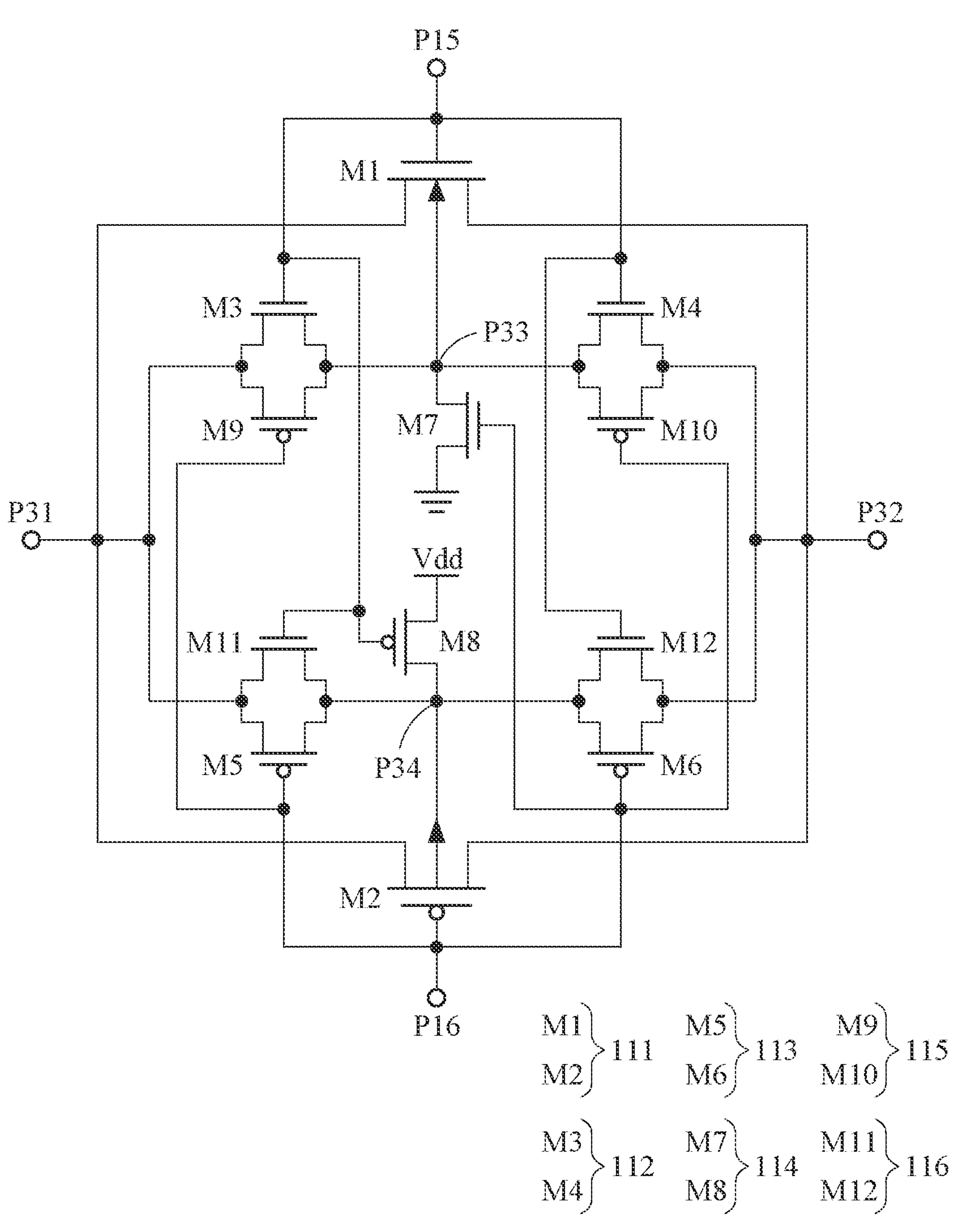
FIG. 11 is a circuit diagram of a switch circuit of an array switch circuit system according to another embodiment of the present disclosure.

Please refer to FIG. 11 which is a circuit diagram of a switch circuit of an array switch circuit system according to another embodiment of the present disclosure. As shown in FIG. 11, the switch circuit (first column switch 11') includes a transmission gate 111, base control sub-circuits 112 and 113, a first transistor group 114, a second transistor group 115 and a third transistor group 116, wherein the electrical connection of the transmission gate 111, the base control sub-circuits 112 and 113 and the first transistor group 114 are the same as that of the transmission gate 111, the base control sub-circuits 112 and 113 and the transistor group 114 of the switch circuit (first column switch 11) shown in FIG. 10, which is not repeated here.

The second transistor group 115 includes transistors M9 and M10. The first terminal of the transistor M9 is electrically connected to the first terminal of the transistor M3, a second terminal of the transistor M9 is electrically connected to the second terminal of the transistor M3, and the control terminal of the transistor M9 is electrically connected to the control terminal of the transistor M5. The first terminal of the transistor M10 is electrically connected the first terminal of the transistor M4, the second terminal of transistor M10 is electrically connected the second terminal of the transistor M4, and the control terminal of the transistor M10 is electrically connected to the control terminal of the transistor M6.

The third transistor group 116 includes the transistors M11 and M12. The first terminal of the transistor M11 may be electrically connected to the first terminal of the transistor M5, the second terminal of the transistor M11 may be connected to the second terminal of the transistor M5, and the control terminal of the transistor M11 may be electrically connected to the control terminal of the transistor M3. The first terminal of the transistor M12 may be electrically connected to the first terminal of the transistor M6, the second terminal of the transistor M12 may be electrically connected the second terminal of the transistor M6, and the control terminal of the transistor M12 may be electrically connected to the control terminal of the transistor M4. That is, the first terminal of the transistor M11 is electrically connected to the I/O terminal P31, the second terminal of the transistor M11 is electrically connected to the base control terminal P34, and the control terminal of the transistor M11 is electrically connected to the gate control terminal P15. The first terminal of the transistor M12 is electrically connected to the gate control terminal P34, the second terminal of the transistor M12 is electrically connected the I/O terminal P32, and the control terminal of the transistor M12 is electrically connected to the gate control terminal P15.

In the embodiment including the second and third transistor groups described above, the switch circuit (first column switch 11') may also perform the dynamic adjustment operation processed by the switch circuit (first column switch 11) described above, thereby solving the problem of increase in the switch on-state resistance may occur due to the difference between the base voltage and the input signal voltage, and accordingly, the switch circuit may have a lower switch on-state resistance and further have a wider channel bandwidth. The switch circuit (first column switch 11') may also perform the operation as mentioned above when the transmission gate 111 is in the off state, the base control sub-circuits 112 and 113, the first transistor group 114, the second transistor group 115, and the third transistor group 116 adjust the base voltage of the transistors M1 and M2 of the transmission gate 111 to the working voltage Vdd and the ground voltage, thereby preventing the problem of current leaking at the base end. Moreover, the base control sub-circuits 112 and 113, the first transistor group 114, the second transistor group 115 and the third transistor group 116 of the switch circuit (first column switch 11') may constitute a circuit structure of which two terminals are balanced, so that no matter if the switch circuit (first column switch 11') performs transmission in a normal direction (for example, from the I/O terminal P31 to the I/O terminal P32) or in an opposite direction (for example, from the I/O terminal P32 to the I/O terminal P31), the switch circuit (first column switch 11') may have the same resistance value. Also, in comparison with the switch circuit (first column switch 11) shown in FIG. 10, the switch circuit (first column switch 11') may have a lower on-state resistance, and further have a faster charging and discharging speed and a wider channel bandwidth.

The circuit structure of the switch circuit (first column switch 11') described above may be regarded as the switch circuit (first column switch 11) shown in FIG. 10 further including a fifth transistor, a sixth transistor, a seventh transistor and an eighth transistor. The first terminal of the fifth transistor is electrically connected the first terminal of the first transistor of the first one of the two base control sub-circuits mentioned above, the second terminal of the fifth transistor is electrically connected to the second terminal of the first transistor of the two base control sub-circuits mentioned above, and the control terminal of the fifth transistor is electrically connected the control terminal of the first transistor of the second one of the two base control sub-circuits. The first terminal of the sixth transistor is electrically connected to the first terminal of the second transistor of the first one of the two base control sub-circuits mentioned above, the second terminal of the sixth transistor is electrically connected to the second terminal of the second transistor of the first one of the two base control sub-circuits, and the control terminal of the sixth transistor is electrically connected the control terminal of the second transistor of the second one of the two base control circuits mentioned above. The first terminal of the seventh transistor is electrically connected the first terminal of the first transistor of the second one of the two base control sub-circuits mentioned above, the second terminal of the seventh transistor is electrically connected to the second terminal of the first transistor of the second one of the two base control sub-circuits, and the control terminal of the seventh transistor is electrically connected to the control terminal of the first transistor of the first one of the two base control sub-circuits. The first terminal of the eighth transistor is electrically connected to the first terminal of the second transistor of the second one of the two base control sub-circuits, the second terminal of the eighth transistor is electrically connected to the second terminal of the second transistor of the second one of the two base control sub-circuits, and the control terminal of the eighth transistor is electrically connected to the control terminal of the second transistor of the first one of the two base control sub-circuits.

Figure 12:
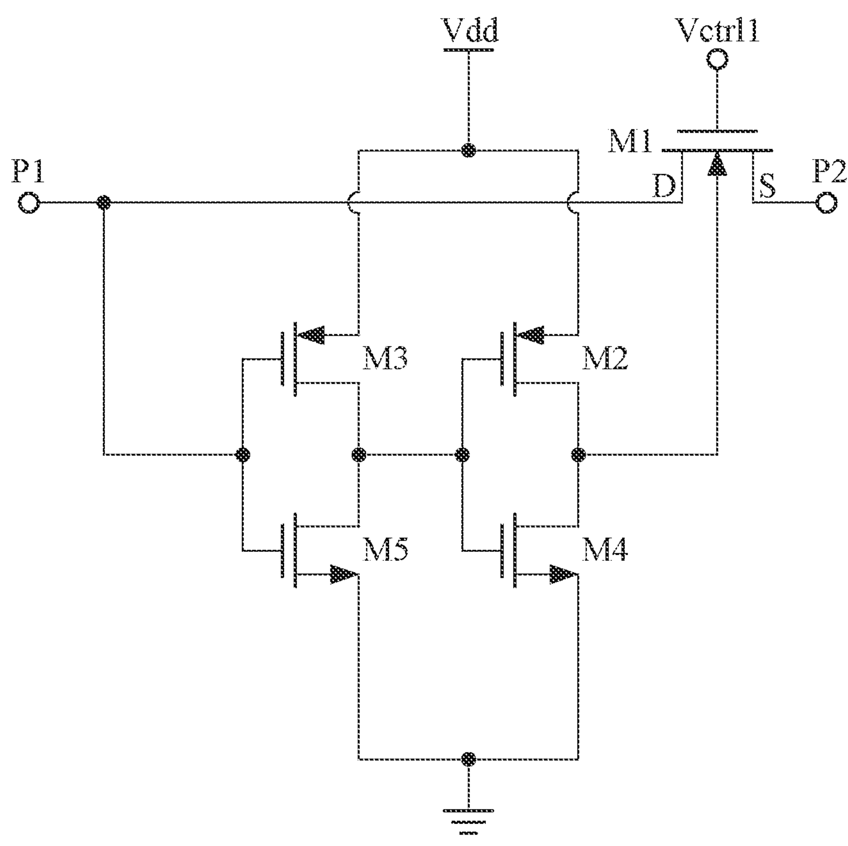
FIG. 12 is a circuit diagram of a switch circuit of an array switch circuit system according to still another embodiment of the present disclosure.

Please refer to FIG. 12 which is a circuit diagram of a switch circuit of an array switch circuit system according to still another embodiment of the present disclosure. As shown in FIG. 12, the switch circuit (first column switch 11") includes transistors M1, M2, M3, M4 and M5. The drain and source of the transistor M1 are connected to the input and output terminals P1 and P2 respectively. The base of the transistor M1 is connected to the drains of the transistors M2 and M4. The gates of the transistors M2 and M4 are connected to the drains of the transistors M3 and M5. The gates of the transistors M3 and M5 are connected to the input and output terminal P1. The sources of the transistors M2 and M3 receive the operating voltage Vdd. The sources of the transistors M4 and M5 are grounded.

In view of the above description, the array switch circuit system of the present disclosure may change the connection of the redistribution layer (RDL) through the control of the array switch for the transmission of low-speed signals, thereby solving the problem of needing to redesign the redistribution layer. For the transmission of high-speed signals, the array switch circuit system may be implemented through transmission lines to achieve low-latency effects. The transmission lines for high-speed signals may be implemented through specially designed coplanar waveguides (CPW) to solve the impedance matching problem of high-speed signals. In this way, the overall packaging carrier board of the array switch circuit system of the present disclosure only needs to customize the metal layer of the transmission line, and the rest are prefabricated designs, thereby shortening product development period and reducing R&D costs, and filling technology gaps for various product packaging. In addition, by setting up additional transmission lines with different impedances between the two conductive pads used to transmit high-speed signals, and using high-frequency single-pole multi-throw switches, the application flexibility may be improved.

What is claimed is:

1. An array switch circuit system, comprising:

a substrate;

a plurality of first conductive pads spaced apart from each other on the substrate and arranged as an array, wherein each of the plurality of first conductive pads has a row position and a column position in the array;

a plurality of first row switches disposed on the substrate, wherein each of the plurality of first row switches connects two adjacent ones of the plurality of first conductive pads corresponding to a same row position;

a plurality of first column switches disposed on the substrate, wherein each of the plurality of first column switches connects two adjacent ones of the plurality of first conductive pads corresponding to a same column position;

a plurality of second conductive pads disposed on the substrate and disposed on a periphery of the plurality of first conductive pads; and a plurality of first transmission lines disposed on the substrate, wherein each of the plurality of first transmission lines connects two of the plurality of second conductive pads and comprises a first conducting strip and two second conducting strips, and the two second conducting strips are respectively located on both sides of the first conducting strip and are coplanar with the first conducting strip.

2. The array switch circuit system of claim 1, wherein the substrate comprises a plurality of layers, the plurality of first transmission lines and the plurality of first row switches are located on different layers of the plurality of layers, and the plurality of first transmission lines and the plurality of first column switches are located on different layers of the plurality of layers.

3. The array switch circuit system of claim 1, wherein the substrate comprises a plurality of layers, the plurality of first conductive pads and the plurality of second conductive pads are located on a first layer among the plurality of layers, and the plurality of first transmission lines are located on a second layer among the plurality of layers adjacent to the first layer.

4. The array switch circuit system of claim 1, wherein the plurality of second conductive pads are arranged into two conductive pad rows and two conductive pad columns, the two conductive pad rows are located at two opposite sides of the array, the two conductive pad columns are located at another two opposite sides of the array, and the two of the plurality of second conductive pads that are connected to one of the plurality of first transmission lines belong to the two conductive pad rows respectively, or belong to the two conductive pad columns respectively.

5. The array switch circuit system of claim 1, wherein a part of the plurality of second conductive pads are arranged into a conductive pad row and a conductive pad column, and the array switch circuit system further comprises:

a plurality of second column switches disposed on the substrate, wherein each of the plurality of second column switches connects two adjacent conductive pads among the conductive pad column; and a plurality of second row switches disposed on the substrate, wherein each of the plurality of second row switches connects two adjacent conductive pads among the conductive pad row.

6. The array switch circuit system of claim 5, further comprising:

a third column switch disposed on the substrate;

a third row switch disposed on the substrate; and a third conductive pad disposed on the substrate, connected to the conductive pad row through the third row switch, and connected to the conductive pad column through the third column switch.

7. The array switch circuit system of claim 1, wherein a target transmission line among the plurality of first transmission lines is connected to a first target conductive pad and a second target conductive pad among the plurality of second conductive pads, and the array switch circuit system further comprises:

a second transmission line having an impedance different from the target transmission line;

a first switching component connected to the first target conductive pad, the target transmission line and the second transmission line, and configured to switch to conduct one of the target transmission line and the second transmission line with the first target conductive pad; and a second switching component connected to the second target conductive pad, the target transmission line and the second transmission line, and configured to switch to conduct one of the target transmission line and the second transmission line with the second target conductive pad.

8. The array switch circuit system of claim 1, wherein a range of characteristic impedance of each of the plurality of first transmission lines ranges from 25 to 150 ohms.

9. The array switch circuit system of claim 1, wherein one of the plurality of first column switches and the plurality of first row switches comprises:

a transmission gate having two input and output terminals, two gate control terminals and two base control terminals, and configured to make the two input and output terminals conduct or not conduct with each other according to voltages of the two gate control terminals;

two base control sub-circuits, each comprising:

a first transistor having a first terminal electrically connected to a first one of the two input and output terminals, a second terminal electrically connected to a first node, and a control terminal electrically connected to a second node; and a second transistor having a first terminal electrically connected to the first node, a second terminal electrically connected to a second one of the two input and output terminals, and a control terminal electrically connected to the second node;

a third transistor having a first terminal electrically connected to a first one of the two base control terminals, a second terminal for grounding, and a control terminal electrically connected to a first one of the two gate control terminals; and a fourth transistor having a first terminal for receiving an operating voltage, a second terminal electrically connected to a second one of the two base control terminals, and a control terminal electrically connected to a second one of the two gate control terminals, wherein the first node and the second node corresponding to one of the two base control sub-circuits are the first one of the two base control terminals and the second one of the two gate control terminals, respectively, and the first node and the second node of the other one of the two base control sub-circuits are the second one of the two base control terminals and the first one of the two gate control terminals, respectively.

10. The array switch circuit system of claim 9, wherein the one of the plurality of first column switches and the plurality of first row switches further comprises:

a fifth transistor having a first terminal of the fifth transistor electrically connected to the first terminal of the first transistor of a first one of the two base control sub-circuits, a second terminal electrically connected to the second terminal of the first transistor of the first one of the two base control sub-circuits, and a control terminal electrically connected to the control terminal of the first transistor of a second one of the two base control sub-circuits; and a sixth transistor having a first terminal of the sixth transistor electrically connected to the first terminal of the second transistor of the first one of the two base control sub-circuits, a second terminal electrically connected to the second terminal of the second transistor of the first one of the two base control sub-circuits, and a control terminal electrically connected to the control terminal of the second transistor of the second one of the two base control sub-circuits.

11. The array switch circuit system of claim 10, wherein the one of the plurality of first column switches and the plurality of first row switches further comprises:

a seventh transistor having a first terminal electrically connected to the first terminal of the first transistor of the second one of the two base control sub-circuits, a second terminal electrically connected to the second terminal of the first transistor of the second one of the two base control sub-circuits, and a control terminal electrically connected to the control terminal of the first transistor of the first one of the two base control sub-circuits; and an eighth transistor having a first terminal electrically connected to the first terminal of the second transistor of the second one of the two base control sub-circuits, a second terminal electrically connected to the second terminal of the second transistor of the second one of the two base control sub-circuits, and a control terminal electrically connected to the control terminal of the second transistor of the first one of the two base control sub-circuits.

* * * * *